United States Patent
Shank et al.

(10) Patent No.: US 10,079,248 B2
(45) Date of Patent: Sep. 18, 2018

(54) FIELD-EFFECT TRANSISTORS WITH A BURIED BODY CONTACT

(71) Applicant: GLOBALFOUNDRIES Inc., Grand Cayman (KY)

(72) Inventors: Steven M. Shank, Jericho, VT (US); Mark D. Jaffe, Essex Junction, VT (US); John J. Pekarik, Underhill, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/355,231

(22) Filed: Nov. 18, 2016

(65) Prior Publication Data

US 2018/0145088 A1 May 24, 2018

(51) Int. Cl.
| H01L 29/78 | (2006.01) |
| H01L 21/02 | (2006.01) |
| H01L 27/12 | (2006.01) |
| H01L 29/06 | (2006.01) |
| H01L 23/528 | (2006.01) |
| H01L 21/84 | (2006.01) |
| H01L 21/8234 | (2006.01) |
| H01L 21/762 | (2006.01) |
| H01L 21/768 | (2006.01) |
| H01L 21/265 | (2006.01) |
| H01L 29/66 | (2006.01) |

(52) U.S. Cl.
CPC ........ H01L 27/1203 (2013.01); H01L 21/265 (2013.01); H01L 21/76224 (2013.01); H01L 21/76838 (2013.01); H01L 21/823481 (2013.01); H01L 21/84 (2013.01); H01L 23/5283 (2013.01); H01L 29/0649 (2013.01); H01L 29/66477 (2013.01)

(58) Field of Classification Search
CPC ............... H01L 27/1203; H01L 21/265; H01L 21/76224; H01L 21/76838; H01L 21/823481; H01L 21/84; H01L 23/5283; H01L 29/0649; H01L 29/66477
USPC .................................. 257/350, 348; 438/151
See application file for complete search history.

(56) References Cited

U.S. PATENT DOCUMENTS

| 6,429,477 | B1* | 8/2002 | Mandelman | H01L 21/743 257/301 |
| 6,436,744 | B1* | 8/2002 | Bryant | H01L 21/743 257/E21.415 |
| 6,437,405 | B2 | 8/2002 | Kim | |
| 6,441,435 | B1 | 8/2002 | Chan | |

(Continued)

*Primary Examiner* — Cuong Q Nguyen
*Assistant Examiner* — Tong-Ho Kim
(74) *Attorney, Agent, or Firm* — Thompson Hine LLP; Anthony Canale

(57) ABSTRACT

Device structures for a field-effect transistor with a body contact and methods of forming such device structures. An opening is formed that extends through a device layer of a silicon-on-insulator (SOI) substrate and into a buried oxide layer of the silicon-on-insulator substrate. The buried oxide layer is laterally etched at the location of the opening to define a cavity in the buried oxide layer. The cavity is located partially beneath a section of the device layer, and the cavity is filled with a semiconductor material to form a body contact. A well is formed in the section of the device layer, and the body contact is coupled with a portion of the well.

18 Claims, 7 Drawing Sheets

(56) References Cited

U.S. PATENT DOCUMENTS

| | | | |
|---|---|---|---|
| 6,469,350 B1 | 10/2002 | Clark, Jr. et al. | |
| 6,930,357 B2 * | 8/2005 | Kang | H01L 21/743 257/347 |
| 8,409,989 B2 | 4/2013 | Pei et al. | |
| 2008/0237708 A1 * | 10/2008 | Mandelman | H01L 29/78615 257/347 |
| 2014/0117409 A1 * | 5/2014 | Chou | H01L 29/78615 257/192 |

* cited by examiner

FIELD-EFFECT TRANSISTORS WITH A BURIED BODY CONTACT

BACKGROUND

The invention relates generally to integrated circuits and, in particular, to device structures for a field-effect transistor with a body contact and methods of forming such device structures.

Complementary-metal-oxide-semiconductor (CMOS) processes may be used to build a combination of p-type field-effect transistors (PFETs) and n-type field-effect transistors (nFETs) that are coupled to implement logic gates and other types of integrated circuits, such as switches. Field-effect transistors generally include an active semiconductor region, a source and a drain defined in the active semiconductor region, and a gate electrode associated with a channel in the active semiconductor region. When a control voltage exceeding a designated threshold voltage is applied to the gate electrode, carrier flow occurs in an inversion or depletion layer in the channel between the source and drain to produce a device output current.

Semiconductor-on-insulator (SOI) substrates may be advantageous in CMOS technology. In comparison with field-effect transistors built using a bulk silicon wafer, a semiconductor-on-insulator substrate permits operation at significantly higher speeds with improved electrical isolation and reduced electrical losses. Contingent on the thickness of the device layer of the SOI substrate, a field-effect transistor may operate in a partially-depleted mode in which the depletion layer in the channel in the device layer does not extend fully to the buried oxide layer when typical control voltages are applied to the gate electrode.

Partially-depleted SOI field-effect transistors may be fabricated with two types, namely floating-body SOI field-effect transistors or body-contacted SOI field-effect transistors. A floating-body SOI field-effect transistor conserves device area due to its comparatively small size, but suffers from the floating body effect due to the absence of a body contact. A floating-body SOI field-effect transistor may be unstable during operation, especially when operating in an RF circuit or a high speed digital circuit, because the threshold voltage is a function of a fluctuating body voltage. A body-contacted SOI field-effect transistor includes a body contact that may eliminate body effects. However, a body-contacted SOI field-effect transistor covers more chip area than a floating-body SOI field-effect transistor, which reduces the density of a circuit built using body-contacted SOI field-effect transistors in comparison with a circuit built using floating-body SOI field-effect transistors.

In connection with SOI switches and low noise amplifiers, a polysilicon T-body contact design may be used to provide body-contacted SOI field-effect transistors. However, such polysilicon T-body contact designs increase both area and capacitance, which results in lower linearity for harmonic distortion in a switch and lower linearity for gain in a low noise amplifier. The polysilicon T-body contact design also reduces the device density in switches and low noise amplifiers, as well as the device density of body-contacted SOI field-effect transistors used in digital logic.

Improved device structures for a body-contacted SOI field-effect transistor and methods of forming such device structures are needed.

SUMMARY

In an embodiment of the invention, a structure includes a well in a device layer of a silicon-on-insulator substrate and a field effect transistor with a gate electrode overlying a portion of the well. The structure further includes a body contact located in a cavity defined in a buried oxide layer of the silicon-on-insulator substrate. The body contact is coupled with the portion of the well.

In an embodiment of the invention, a method includes forming an opening extending through a device layer of a silicon-on-insulator substrate and into a buried oxide layer of the silicon-on-insulator substrate, and laterally etching the buried oxide layer at the location of the opening to define a cavity in the buried oxide layer. The cavity is located partially beneath a section of the device layer. The method further includes filling the cavity with a semiconductor material to form a body contact. A well is formed in the section of the device layer, and the body contact is coupled with a portion of the well.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
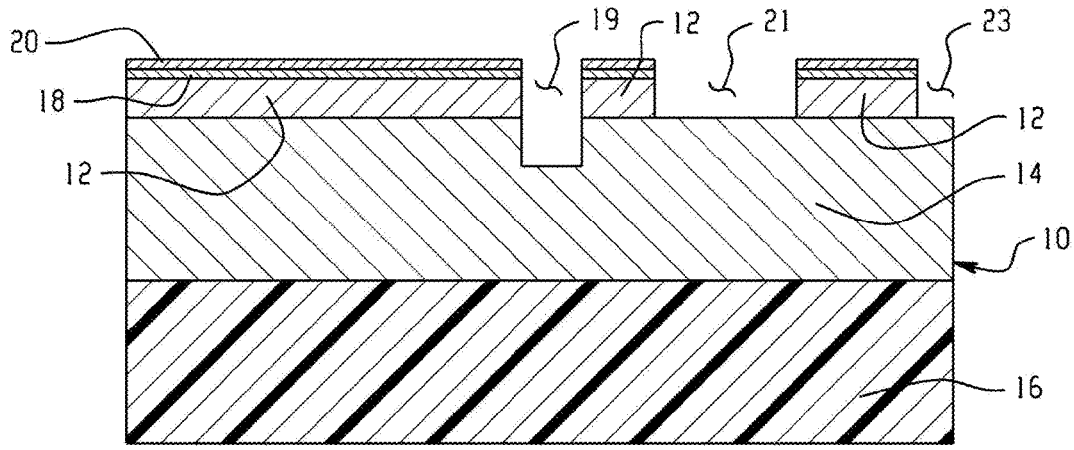
FIGS. 1-8 are cross-sectional views of a portion of a substrate at successive stages of a fabrication process forming a device structure in accordance with embodiments of the invention.

With reference to FIG. 1 and in accordance with an embodiment of the invention, a substrate 10 in the representative form of a semiconductor-on-insulator (SOI) substrate includes a device layer 12, a buried dielectric layer in the form of a buried oxide (BOX) layer 14 comprised of an oxide of silicon (e.g., $SiO_2$), and a handle wafer 16. The device layer 12 is separated from the handle wafer 16 by the intervening BOX layer 14 and is considerably thinner than the handle wafer 16. The device layer 12 and the handle wafer 16 may be comprised of a single crystal semiconductor material, such as silicon. The BOX layer 14 has a surface in direct contact with the handle wafer 16 along an interface and another surface in direct contact with the device layer 12 along another interface, and these surfaces are separated by the thickness of the BOX layer 14 that terminates at the rim of the substrate 10. The device layer 12 is electrically isolated from the handle wafer 16 by the BOX layer 14. The handle wafer 16 may be lightly doped to have, for example, p-type conductivity. The front side of the substrate 10 including the device layer 12 may be considered to be an active device side of the substrate 10.

Pad layers 18, 20 are located on a top surface of device layer 12. The materials forming the pad layers 18, 20 may be chosen to etch selectively to the semiconductor material constituting the device layer 12 and to be readily removed at a subsequent fabrication stage. The pad layers 18, 20 operate as protection layers for the top surface of the device layer 12 during, for example, etching processes. Pad layer 18 may be composed of a dielectric material, such as silicon dioxide ($SiO_2$) grown by oxidizing the top surface of device layer 12 or deposited by chemical vapor deposition (CVD). Pad layer 20 may be composed of a dielectric material, such as silicon nitride ($Si_3N_4$) deposited by CVD.

The device layer 12 is patterned to define openings 19, 21, 23 that penetrate through the full thickness of the device layer 12 to the top surface of the BOX layer 14. The pad layers 18, 20 may be patterned to form a hardmask by applying a photoresist layer (not shown) on pad layer 20, lithographically patterning the photoresist layer to define a set of openings in the patterned photoresist layer, and transferring the pattern from the photoresist layer to the pad layers 18, 20 with an etching process. After the pad layers 18, 20 are patterned, the pattern is transferred by an etching process, such as reactive ion etching (RIE), using a suitable etch chemistry to form the openings 19, 21, 23 in the device layer 12, which are laterally separated by a section of the device layer 12. The photoresist layer may be stripped after the openings 19, 21, 23 in the device layer 12 are formed, followed by a conventional cleaning process.

The opening 19 may penetrate to a given depth into the BOX layer 14 in contrast to the openings 21, 23 that penetrate only to the top surface of the BOX layer 14. To that end, after the openings 19, 21, 23 are formed that penetrate through the device layer 12, a photoresist layer (not shown) may be applied on pad layer 20 and lithographically patterned to define an opening in the photoresist layer that is aligned with the opening 19. The BOX layer 14 is etched with RIE using a suitable etch chemistry at the location of the opening 19 aligned with the opening in the patterned resist layer. The photoresist layer covers the openings 21, 23 in the device layer 12 and protects the BOX layer 14 against etching at these locations.

Figure 2:
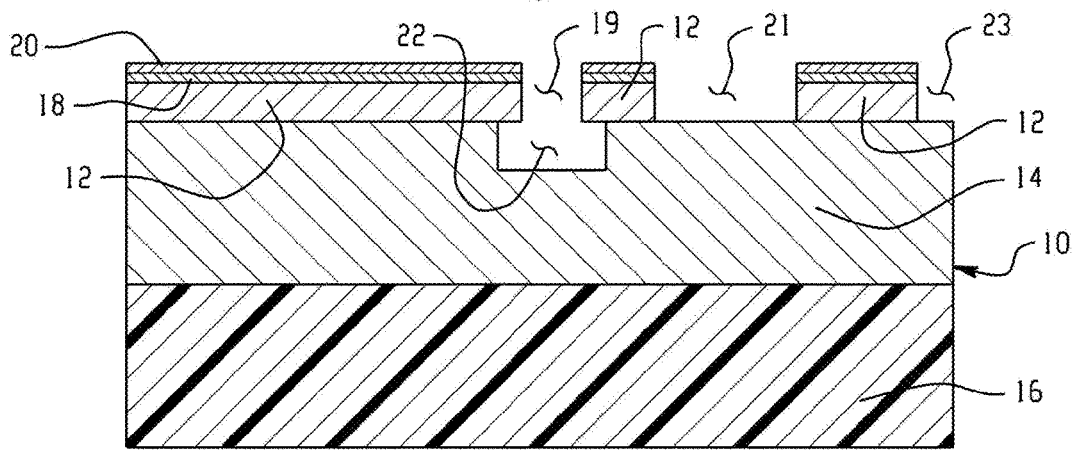

With reference to FIG. 2 in which like reference numerals refer to like features in FIG. 1 and at a subsequent fabrication stage, a cavity 22 is formed in the BOX layer 14 that undercuts the device layer 12 at its edges and that faces upward toward the device layer 12. The cavity 22, which is aligned vertically with the portion of the opening 19 in the device layer 12, may be patterned using the same photoresist layer (not shown) used to extend the opening 19 into the BOX layer 14 and then etching the BOX layer 14 with an isotropic etch using, for example, a wet chemical solution containing hydrofluoric acid (HF). The isotropic etch isotropically removes the material of the BOX layer 14 selective to the material of the device layer 12, which widens and deepens the opening 19 in the BOX layer 14 and, through the increase in width, creates the undercut that extends beneath the device layer 12. The photoresist layer covers the openings 21, 23 such that the BOX layer 14 is again protected against etching at the location of openings 21, 23. The photoresist layer may be stripped after the cavity 22 is formed by the etching processes, followed by a conventional cleaning process.

Figure 3:
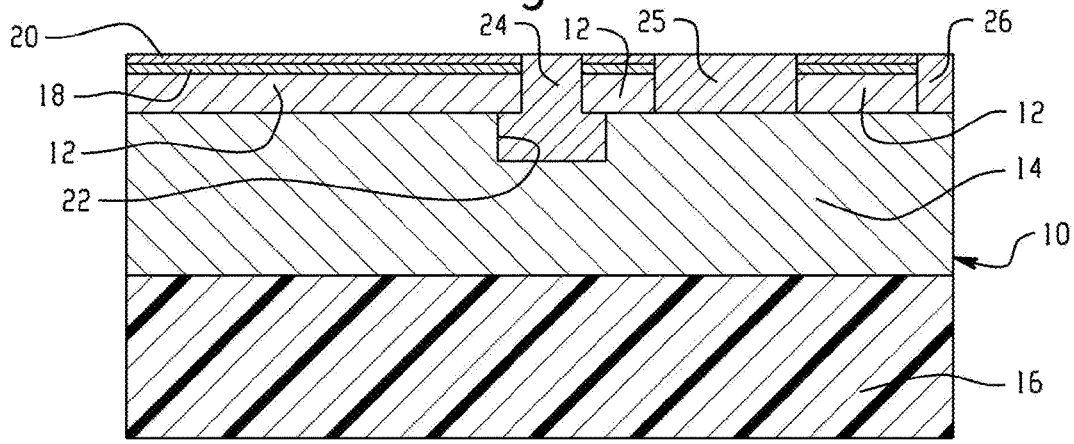

With reference to FIG. 3 in which like reference numerals refer to like features in FIG. 2 and at a subsequent fabrication stage, the opening 19 and cavity 22, the opening 21, and the opening 23 are each filled with respective sections 24, 25, 26 of a layer of semiconductor material. In an embodiment, the material constituting the sections 24, 25, 26 of the semiconductor material layer may comprise a polycrystalline semiconductor material, such as undoped polycrystalline silicon (i.e., polysilicon), or an amorphous semiconductor material, such as amorphous silicon, that is deposited by CVD and planarized relative to the top surface of the pad layer 20 by, for example, chemical mechanical polishing (CMP). The section 25 of the semiconductor material layer conforms to the combined shape and geometry of the opening 19 and cavity 22.

Figure 4:
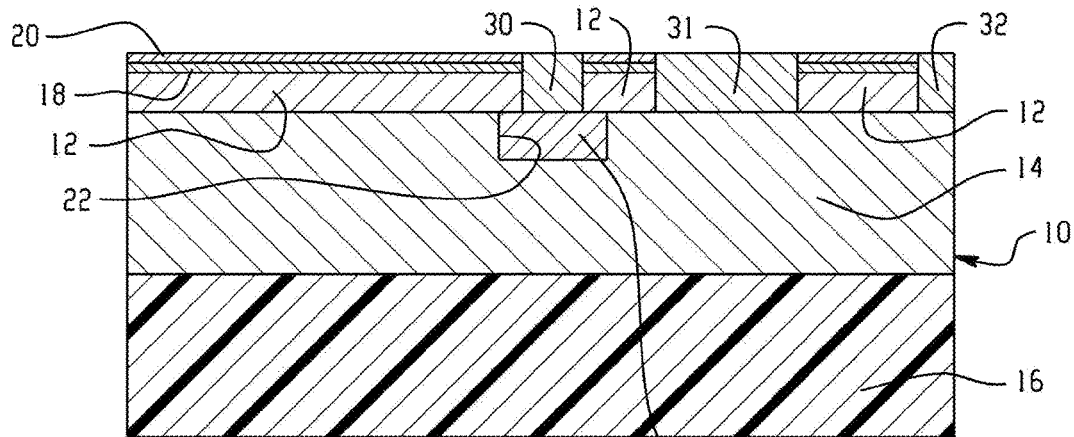

With reference to FIG. 4 in which like reference numerals refer to like features in FIG. 3 and at a subsequent fabrication stage, a portion of section 24 of the semiconductor material layer in the opening 19 is removed to the depth of the top surface of the BOX layer 14. The partial removal of section 24 only from the opening 19 leaves a body contact 28 inside the cavity 22 and embedded in the BOX layer 14. The sections 25, 26 of the semiconductor material layer are also removed from the openings 19, 21, which reopens the openings 21, 23.

Trench isolation regions 30, 31, 32 are formed in the openings 19, 21, 23 formerly occupied by the removed sections 24, 25, 26 of the semiconductor material layer. The trench isolation regions 30, 31, 32 may be formed by depositing a dielectric material to fill the trenches and planarizing the dielectric material relative to the top surface of the pad layer 20 using, for example, CMP. The dielectric material comprising the trench isolation regions 30, 31, 32 may be an oxide of silicon (e.g., silicon dioxide ($SiO_2$)) or another electrical insulator deposited by CVD. The body contact 28 is buried in the BOX layer 14 beneath the plane of the horizontal interface between the device layer 12 and the BOX layer 14, and also beneath the trench isolation region 30 and the surrounding sections of the device layer 12.

In an alternative embodiment, the trench isolation regions 30, 31, 32 may be formed using a wet or dry oxidation process that oxidizes the full height of the semiconductor material layer inside each of the openings 19, 21, 23 and then polishing the oxide by, for example, CMP to be coplanar with the top surface of the pad layer 20. In another alternative embodiment, the trench isolation regions 30, 31, 32 may be formed by partially recessing the semiconductor material relative to the top surface of the pad layer 20 and then performing the wet or dry oxidation process following by, if necessary, polishing.

Figure 5:
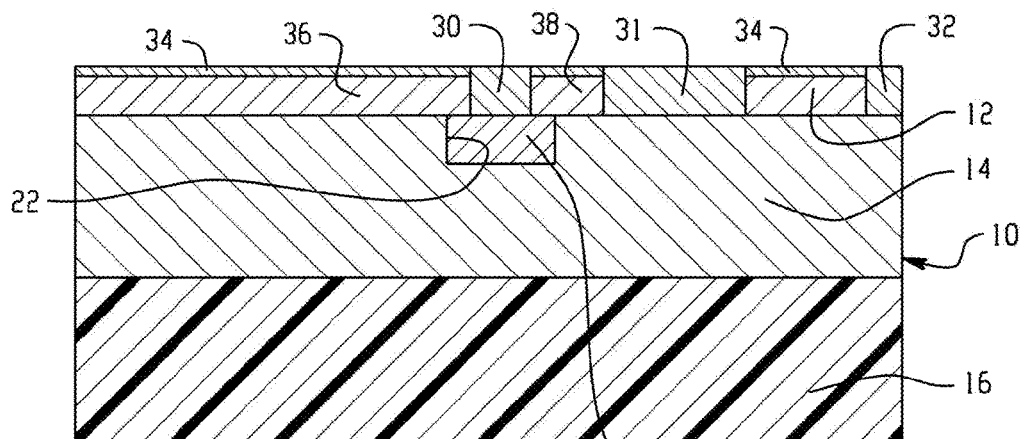

With reference to FIG. 5 in which like reference numerals refer to like features in FIG. 4 and at a subsequent fabrication stage, the pad layers 18, 20 are removed from the top surface of the device layer 12. A screen oxide layer 34 and an implantation mask (not shown) are formed on the top surface of the device layer 12. The implantation mask may comprise a photoresist that is applied as a coating by a spin coating process, pre-baked, exposed to light projected through a photomask, baked after exposure, and developed with a chemical developer to form a pattern of openings. At the location of the openings in the implantation mask, ions are introduced by ion implantation into the device layer to form a well 36 in a section of the device layer 12 and a contact region 38 in a different section of the device layer 12. The implantation conditions are selected to implant ions into the body contact 28.

The ions used to form the body contact 28, well 36, and contact region 38 may be generated from a suitable source gas and implanted using an ion implantation tool. The implantation conditions (e.g., ion species, dose, kinetic energy, angle of incidence) are selected to deliver the ions with a given concentration profile at the locations defined by the openings in the implantation mask. The ions are stopped by the implantation mask so that the device layer 12 is not implanted where masked. In an embodiment, the semiconductor materials of the body contact 28, well 36, and contact region 38 may have p-type conductivity produced by implanting a given concentration profile of an ion species that delivers a dopant from Group III of the Periodic Table (e.g., boron). In an alternative embodiment, the semiconductor materials of the body contact 28, well 36, and contact region 38 may have n-type conductivity produced by implanting a given concentration profile of an ion species that delivers a dopant from Group V of the Periodic Table (e.g., phosphorus (P), arsenic (As), or antimony (Sb)).

The well 36 and the contact region 38 are separated horizontally from each other by the trench isolation region 30, and the body contact 28 extends horizontally beneath the trench isolation region 30 to couple the well 36 with the contact region 38. After activation, the implanted dopant operates to enhance the electrical conductivity of the semiconductor material of the body contact 28, the well 36, and the contact region 38. The contact region 38 is comprised of the semiconductor material of the device layer 12 (e.g., single-crystal silicon) and has the same conductivity type as the body contact 28 and the well 36.

Figure 6:
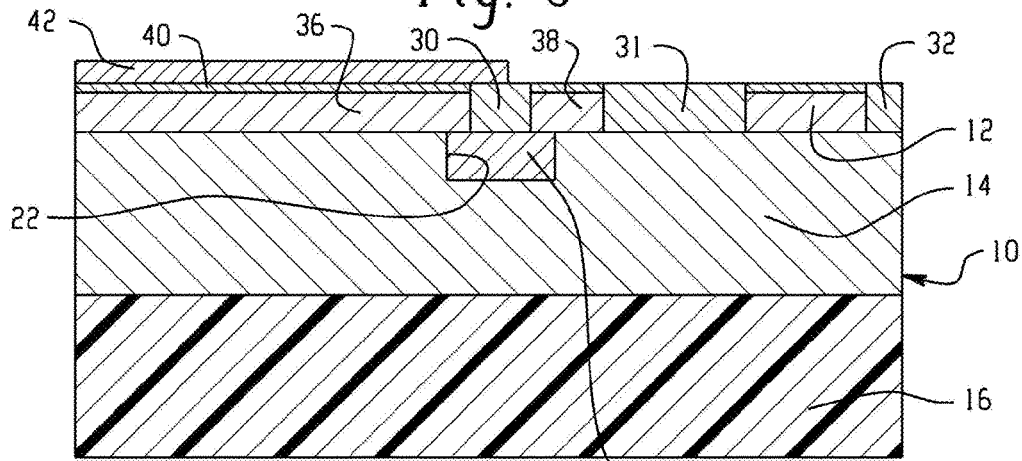

With reference to FIG. 6 in which like reference numerals refer to like features in FIG. 5 and at a subsequent fabrication stage, the screen oxide layer 34 is removed from the top surface of the device layer 12. A gate dielectric 40 and gate electrode 42 characteristic of a gate finger for a field-effect transistor are formed on the top surface of the device layer 12 at a location overlying the well 36. The gate dielectric 40 may be comprised of an electrical insulator with a dielectric constant (e.g., a permittivity) characteristic of a dielectric material. For example, the gate dielectric 40 may be comprised of silicon dioxide or a high-k dielectric material, such as hafnium oxide, that is deposited by CVD, atomic layer deposition (ALD), etc. The gate electrode 42 may be comprised of an electrical conductor, such as doped polysilicon, a metal, or a combination of these materials, that is deposited by CVD, ALD, etc. Additional gate fingers (not shown) may be formed that are coupled with the gate electrode 42 at an end that is opposite to the end 43.

Figure 7A:
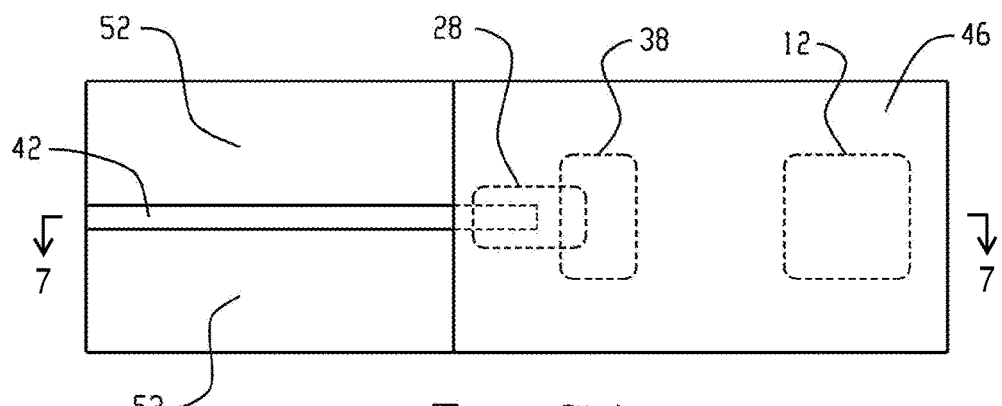
FIG. 7A is a top view of the device structure of FIG. 7 in which the cross-section in FIG. 7 is taken generally along line 7-7.
Figure 7:
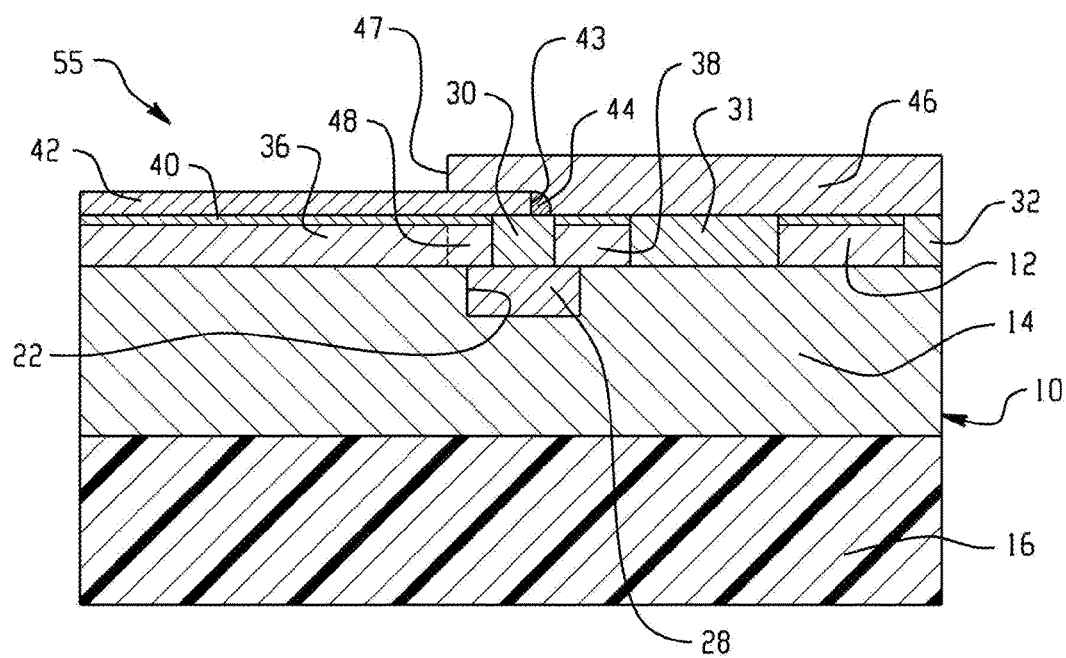

With reference to FIGS. 7, 7A in which like reference numerals refer to like features in FIG. 6 and at a subsequent fabrication stage, a spacer 44 is formed on the gate electrode 42. The gate electrode 42 terminates in a horizontal direction at an end 43 that vertically overlies the trench isolation region 30 and that is covered by the spacer 44. After the spacer 44 is formed, an implantation mask 46 is formed on the top surface of the device layer 12. The implantation mask 46 may comprise a photoresist that is applied as a coating by a spin coating process, pre-baked, exposed to light projected through a photomask, baked after exposure, and developed with a chemical developer to form a pattern of openings. The implantation mask 46 overlaps in space with the well 36 such that a strip 48 of the well 36 is covered and not implanted by the subsequent ion implantation. To that end, the implantation mask 46 has an edge 47 that is aligned parallel to, and spaced horizontally from, an edge defined at the vertical interface between the trench isolation region 30 and the well 36 to provide the overlap.

Ions are introduced by implantation on opposite sides of the gate electrode 42 to form source/drain regions 52, 53 of a field-effect transistor 55 in the device layer 12. In one embodiment, the source/drain regions 52, 53 may be constituted by semiconductor material of the device layer 12 that is heavily doped by masked ion implantation with an n-type dopant (e.g., phosphorus (P) or arsenic (As)). In another embodiment, the source/drain regions 52, 53 may comprise semiconductor material of the device layer 12 that is heavily doped by masked ion implantation with a p-type dopant (e.g., boron (B)).

The field-effect transistor 55 includes a channel region coinciding spatially with a strip of the well 36 that is vertically beneath the gate electrode 42 and laterally between the source/drain region 52 and the source/drain region 53. The semiconductor material constituting the source/drain regions 52, 53 has an opposite conductivity type from the semiconductor material of the channel region in the well 36. Due to the overlap of the implantation mask 46 with the well 36, the strip of the well 36 retains its initial conductivity type during the formation of the source/drain regions 52, 53.

Additional spacers, a halo region, and lightly-doped extensions (not shown) of the field-effect transistor 55 may be formed in the device layer 12 by masked ion implantation before the source/drain regions 52, 53 are formed and/or the spacer 44 is formed. An implantation mask (not shown), which overlaps the well 36 in a manner similar to implantation mask 46, is applied when forming the halo regions and extensions to prevent counterdoping of the strip 48 of the well 36 that could form a junction with the body contact 28.

Figure 8:
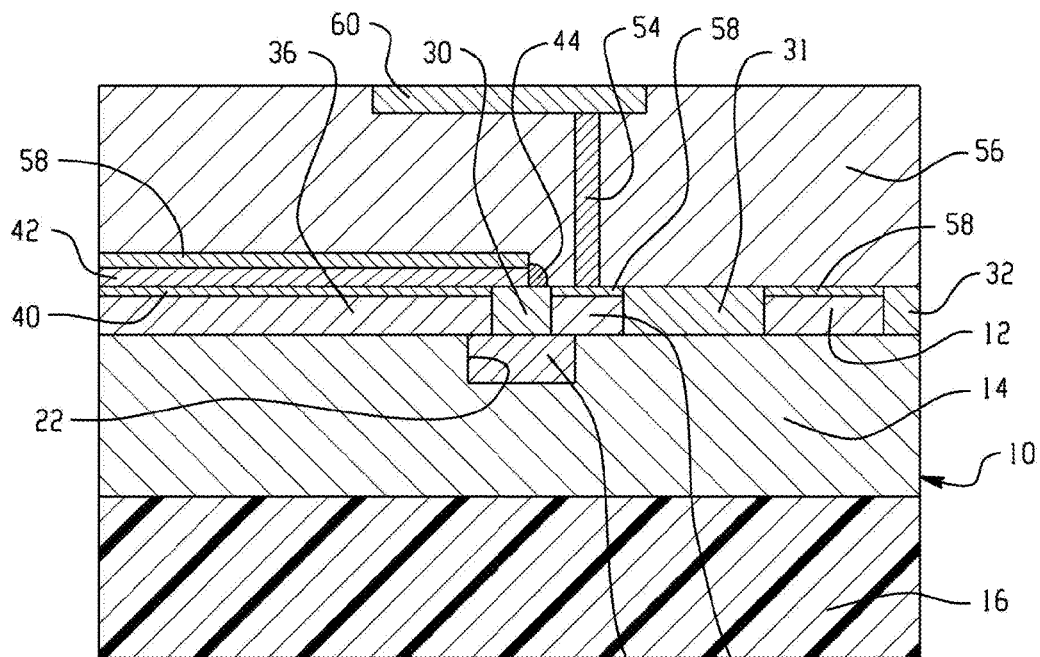

With reference to FIG. 8 in which like reference numerals refer to like features in FIGS. 7, 7A and at a subsequent fabrication stage, silicidation, middle-of-line (MOL) processing, and back-end-of-line (BEOL) processing follows, which includes formation of contacts and wires for local interconnect wiring overlying the field-effect transistor, and formation of dielectric layers, vias, and wires for an interconnect structure coupled by the interconnect wiring with the field-effect transistor 55 and the body contact 28. In particular, a contact 54 of the local interconnect level is formed in a contact opening extending through a dielectric layer 56 to a section of a silicide layer 58 formed on the contact region 38. A wire 60 is coupled with the contact region 38 by the contact 54.

The silicide layer 58 may be formed by a salicidation process (i.e., self-aligned silicidation) that involves one or more annealing steps reacting a deposited layer of a silicide-forming metal, such as titanium (Ti), cobalt (Co), or nickel (Ni), with semiconductor materials of the device layer 12, contact region 38, and gate electrode 42 to form a silicide phase at their respective top surfaces. The dielectric layer 56 may be comprised of one or more electrically-insulating materials, such as silicon dioxide ($SiO_2$), silicon nitride ($Si_3N_4$), etc., deposited by CVD. The contact 54 may be comprised of an electrically-conductive material, such as tungsten (W), deposited inside a vertical contact hole in the dielectric layer 56 and the wire 60 may be comprised of an electrically-conductive material, such as copper (Cu), formed by a damascene process in a trench in the dielectric layer 56.

The body contact 28 has an opposite conductivity type from the source/drain regions 52, 53 of the field-effect transistor 55 and has the same conductivity type as the well 36 and the contact region 38. Field-effect transistors (not shown) complementary to field-effect transistor 55 may be formed using different regions of the substrate 10 and may include source/drain regions formed by implanting ions having the same conductivity type as the ions implanted into the body contact 28, and may be used to further to increase the dopant concentration of the body contact 28. For example, if the source/drain regions 52, 53 have n-type conductivity and the well 36 has p-type conductivity such that the field-effect transistor 55 is a p-channel field-effect transistor, then the source/drain regions of the complementary field-effect transistors are formed by the implantation of ions of a p-type dopant, which may also be introduced into the body contact 28 using the same mask.

In embodiments of the invention, the body contact 28 is produced by a buried contact scheme in which the body contact 28 is separated from the active region of the device layer 12 that includes the field-effect transistor 55 by a trench isolation region 30 in the plane of the active region and that is connected to the body of the active region from below the plane of the active region. Consequently, the need to separate the body contact 28 from the active region with a conventional polysilicon T-body contact is eliminated.

The parasitic capacitance due to the body contact 28 is independent of the gate dielectric 40 and its thickness and composition. In particular, the parasitic capacitance due to the body contact 28 may be significantly less (e.g., 10 to 30 times lower) than the parasitic capacitance for a conventional polysilicon T-body contact design because the parasitic capacitance scales with the body thickness between the gate electrode 42 and the body contact 28 rather than the considerably smaller thickness of the gate dielectric 40 as is conventional.

Parasitic capacitance may be further reduced because the body contact 28 is partially surrounded by the trench isolation regions 30, 31 and because the contact region 38 is fully surrounded by the trench isolation regions 30, 31. The isolation of the body contact 28 from the well 36 by the trench isolation region 30 is independent of junction ground rules, which contributes to reducing the area needed to form the body contact 28. In addition, the overlap between the gate electrode 42 and the buried body contact 28 is minimized through edge and size selection, which also contributes to reducing the parasitic capacitance.

Figure 9:
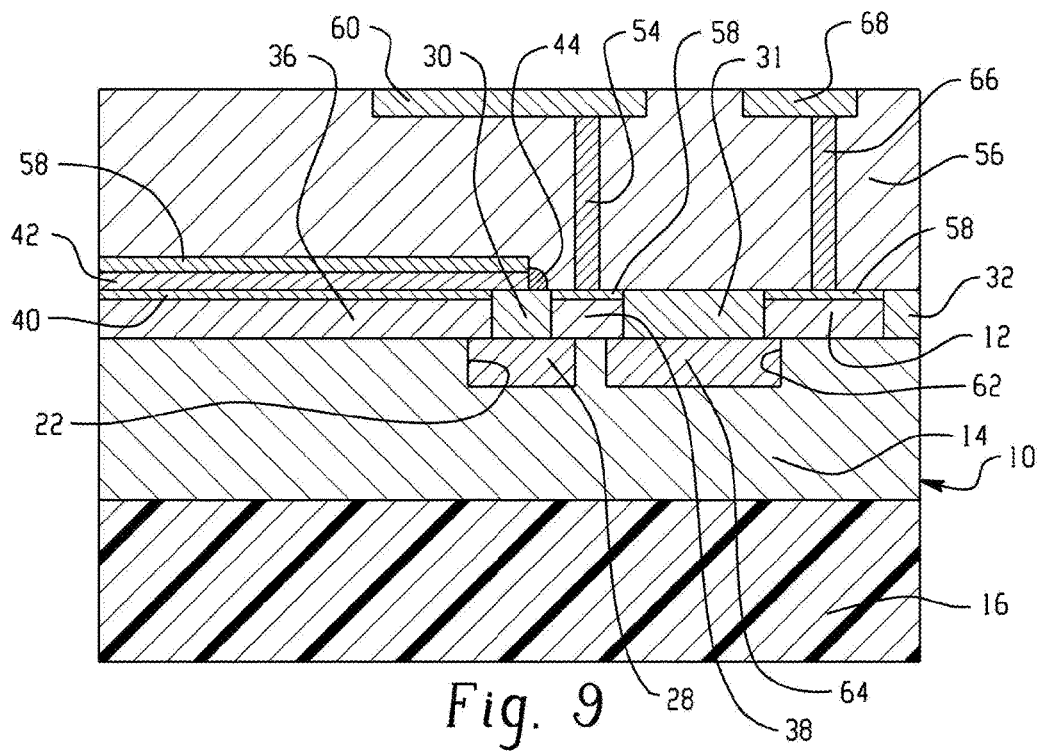
FIG. 9 is a cross-sectional view of a device structure fabricated in accordance with alternative embodiments of the invention.

With reference to FIG. 9 in which like reference numerals refer to like features in FIG. 8 and in accordance with alternative embodiments of the invention, another cavity 62 may be formed in the BOX layer 14, as described in the context of FIG. 2, when the cavity 22 is formed. The cavity 62 is formed by extending the opening 21 to penetrate into the device layer 12, and then isotropically etching to widen the opening to form cavity 62. Cavity 62 may be concurrently formed with cavity 22. The cavity 62 is filled with a section of the semiconductor layer used to fill cavity 22 and form the body contact 28, as described in the context of FIG. 3. The section of the semiconductor layer in the portion of the opening 21 penetrating through the device layer 12 is subsequently removed and this portion of the opening 21 is filled with electrical insulator to define the trench isolation region 31, as described in the context of FIG. 4.

The semiconductor material contained in the cavity 62 and covered in part by the trench isolation region 31 may define a resistor 64. The resistor 64 may be implanted in a manner similar to body contact 28 and concurrently with the implantation of the body contact 28 to provide the same conductivity type as the semiconductor material constituting the body contact 28. Alternatively, the resistor 64 may be separately implanted to have an opposite conductivity type from the semiconductor material constituting the body contact 28. The resistor 64 is located entirely in the BOX layer 14 and beneath the planar interface between the device layer 12 and BOX layer 14, as is the body contact 28. The resistor 64 has a section at one end that is coupled with the contact region 38 in the device layer 12 and thereby with wire 60 through contact 54. The resistor 64 has another section at an opposite end that is coupled by a contact 66 with a wire 68 in the dielectric layer 56.

Figure 10:
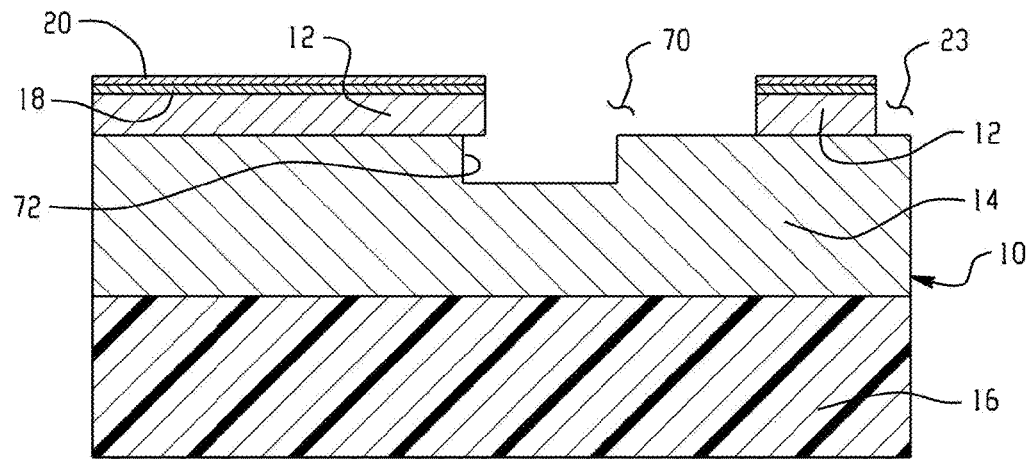
FIGS. 10-12 are cross-sectional views of a device structure at successive stages of a fabrication process in accordance with alternative embodiments of the invention.

With reference to FIG. 10 in which like reference numerals refer to like features in FIG. 2 and in accordance with alternative embodiments of the invention, an opening 70 is formed in the device layer 12 and in the BOX layer 14 by a masked etching process as described above in the context of FIG. 1 with respect to opening 19. The opening 70 is larger than opening 19, and replaces both of the openings 19, 21 formed in the device layer 12. A cavity 72, which is also larger than cavity 22, is formed in the BOX layer 14 from the section of the opening 19 in the device layer with a masked isotropic etch, as described above in the context of FIG. 2. Similar to cavity 22, a portion of the cavity 72 undercuts the device layer 12.

Figure 11:
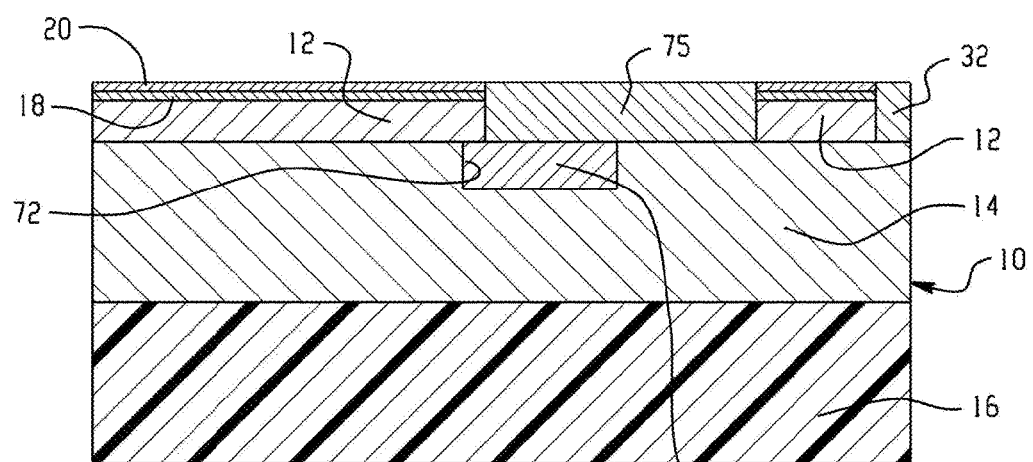

With reference to FIG. 11 in which like reference numerals refer to like features in FIG. 10 and at a subsequent fabrication stage, the cavity 72 is filled with a section of the semiconductor layer to form the body contact 28, as described in the context of FIG. 3. The section of the semiconductor layer in the opening 70 above the cavity 72 is removed and the opening 70 is filled with electrical insulator to define a trench isolation region 75 in the device layer 12, as described in the context of FIG. 4. The trench isolation region 75 partially overlies the body contact 28, and replaces the trench isolation regions 30, 31 (FIG. 4) in the device layer 12. The trench isolation region 75 is wider than trench isolation region 30.

Figure 12:
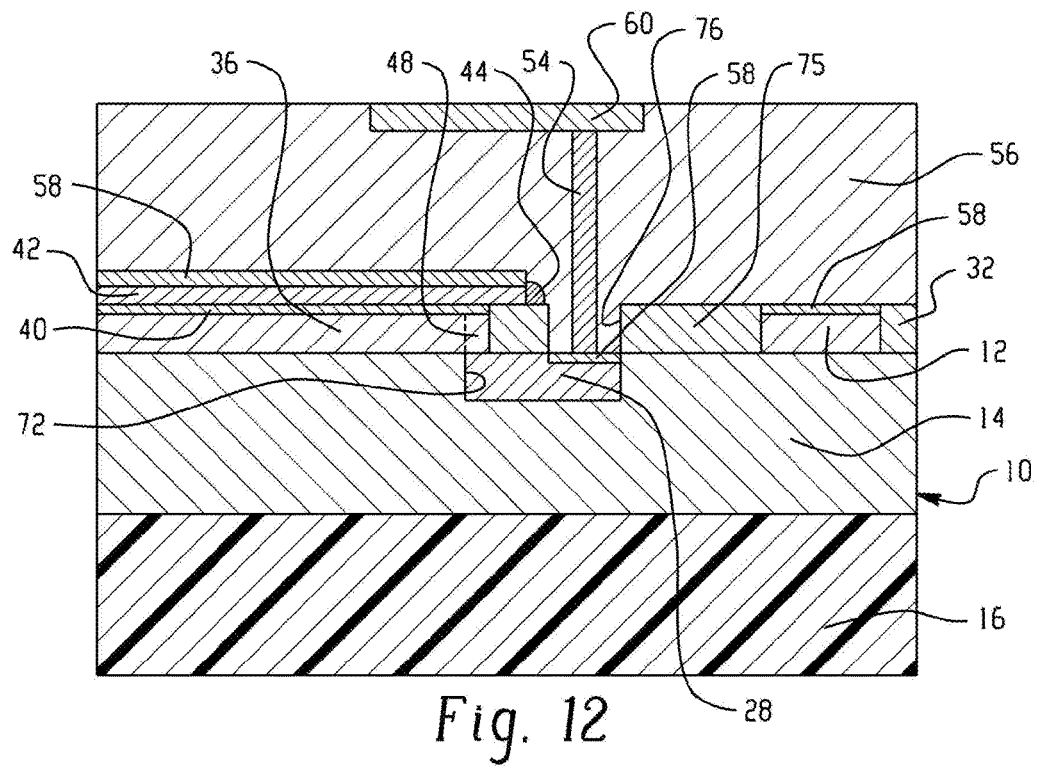

With reference to FIG. 12 in which like reference numerals refer to like features in FIG. 11 and at a subsequent fabrication stage, processing continues as described in the context of FIGS. 5-8 to produce the device structure in FIG. 12. However, because the contact region 38 is absent in this embodiment, an opening 76 aligned with a portion of the body contact 28 is formed in the trench isolation region 75 using a different etch mask, and a section of the silicide layer 58 is formed directly on the top surface of this portion of the body contact 28. The contact 54 extends through the opening 76 to be coupled with this silicide-covered portion of the body contact 28. The portion of the body contact 28 that includes the section of the silicide layer 58 may be considered to constitute a contact region, similar in function to contact region 38 (FIG. 8). The contact region included in the body contact 28 is comprised of the polycrystalline semiconductor material of the body contact 28 and not the single-crystal semiconductor material of the device layer 12 as is the contact region 38.

Figure 13:
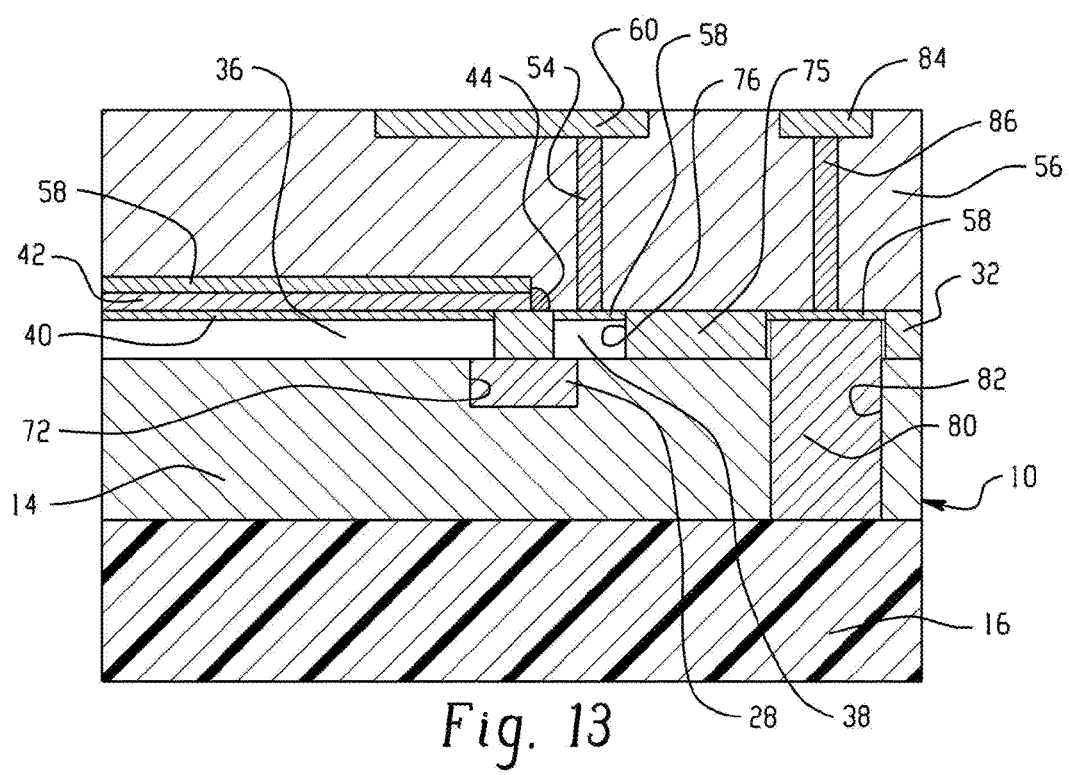
FIGS. 13-15 are cross-sectional views of device structures fabricated in accordance with alternative embodiments of the invention.

With reference to FIG. 13 in which like reference numerals refer to like features in FIG. 8 and in accordance with alternative embodiments of the invention, a contact 80 may be formed in an opening 82 that penetrates through the section of the device layer 12 between trench isolation region 31 and trench isolation region 32, and through the BOX layer 14 to the handle wafer 16. The opening 82 is formed by etching the section of the device layer 12 between trench isolation regions 31 and 32, and then etching through the BOX layer 14 to the handle wafer 16 with a separate etch mask (not shown) that only includes a single opening aligned with the section of the device layer 12 between trench isolation regions 31 and 32. For example, the opening 82 may be formed after the cavity 22 is formed in the context of FIG. 2, but before the body contact 28 is formed in the context of FIG. 3. The contact 80, which may be referred to as a handle wafer contact, may be formed by filling the opening 82 with a section of the same semiconductor material used to fill the cavity 22 and to form the body contact 28.

Processing continues as described in the context of FIGS. 4-8 to produce the device structure in FIG. 13. A wire 84 may be connected by a contact 86 with the contact 80 so that the handle wafer 16 can be contacted from the front side of the substrate 10. The body contact 28 and the contact 80 to the handle wafer 16 are simultaneously formed from semiconductor material (e.g., polysilicon) that is deposited in the cavity 22 and the opening 82, and with the need for only a single additional mask that is required to define the opening 82.

Figure 14:
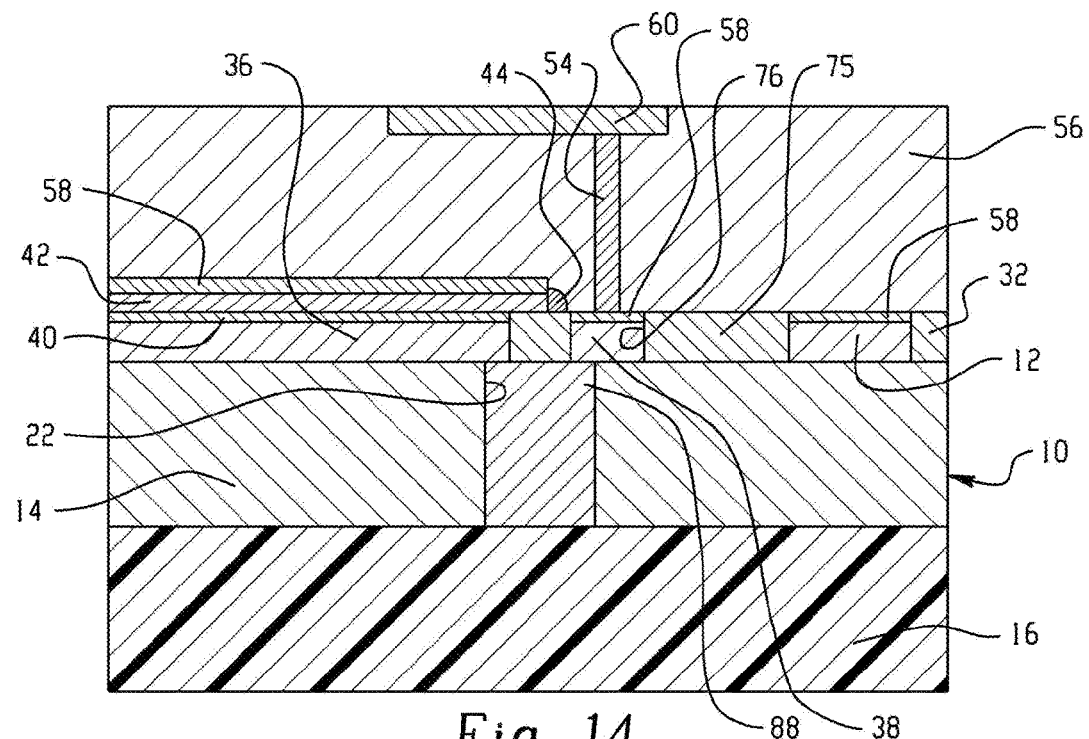

With reference to FIG. 14 in which like reference numerals refer to like features in FIG. 8 and in accordance with alternative embodiments of the invention, a body contact 88 represents a modified version of the body contact 28 and also further functions as a handle wafer contact. The body contact 88 may be formed by extending the depth of the initial opening 19 (FIG. 1) completely through the BOX layer 14 to the handle wafer 16 before the isotropic etch is used to widen the initial opening 19 and create the undercut providing the final shape of the cavity 22. The cavity 22, now deepened and penetrating completely through the BOX layer 14, is filled by semiconductor material to form the body contact 88 that also functions as a handle wafer contact. The formation of the body contact 88 in this instance to also provide a handle wafer contact does not require a separate mask to define the deepened cavity 22. Processing continues as described in the context of FIGS. 4-8 to produce the device structure in FIG. 13.

Figure 15:
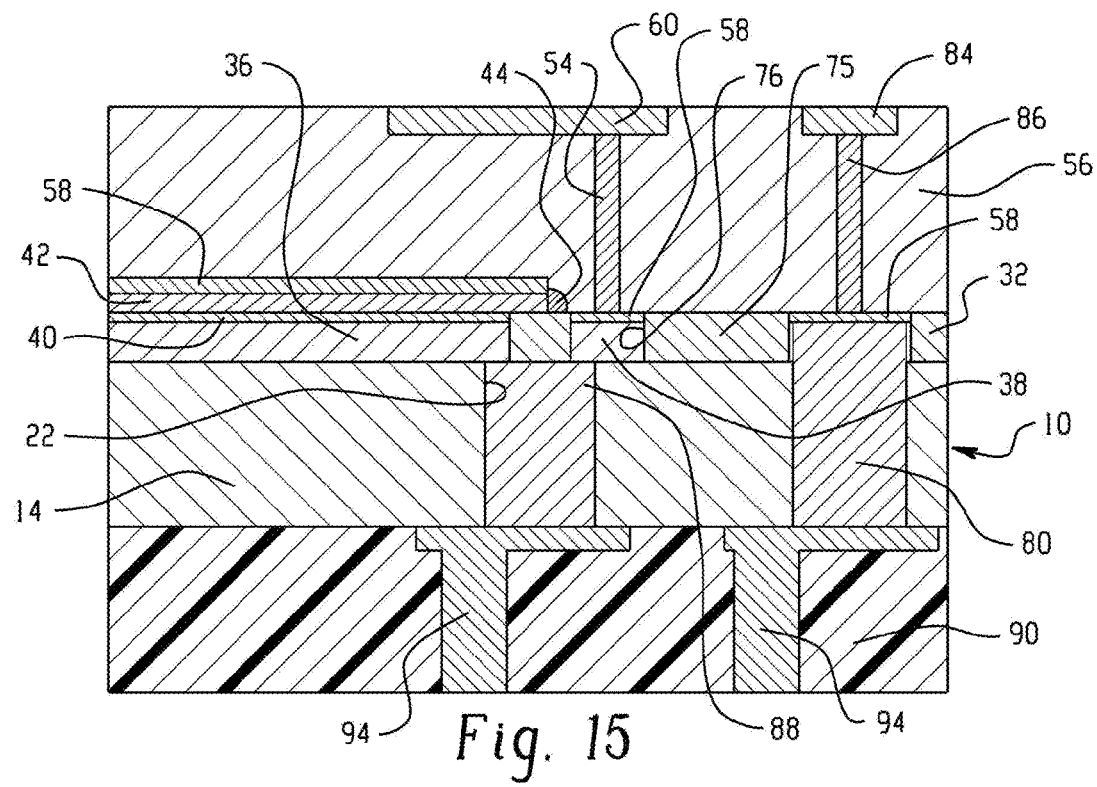

With reference to FIG. 15 in which like reference numerals refer to like features in FIGS. 13, 14 and in accordance with alternative embodiments of the invention, the handle wafer 16 may be removed from the backside of the SOI substrate 10 by grinding and/or polishing, and replaced by a different permanent substrate 90 through the use of a layer transfer technique. The permanent substrate 90 may be comprised of silicon, high resistance silicon, sapphire, quartz, alumina, or another suitable material, and may include metallization 94 that is connected with the body contact 88 so that the body contact 88 can be contacted from the backside of the composite structure.

In an embodiment, the device structure may further include the contact 80 and metallization 94 associated with the permanent substrate 90 that is connected with the contact 80. The body contact 88 and the contact 80 may be formed from portions of a semiconductor material (e.g., polysilicon) that is deposited simultaneously into the cavity 22 and the opening 82.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product. For example, the field-effect transistor 55 may be used in a switch, a low noise amplifier, or a logic circuit.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a well in a section of a device layer of a silicon-on-insulator substrate;
   a field effect transistor with a gate electrode overlying a portion of the well;
   a body contact located in a first cavity extending partially through a buried oxide layer of the silicon-on-insulator substrate, the body contact embedded in the buried oxide layer beneath an interface between the device layer and the buried oxide layer, the body contact located partially beneath the section of the device layer, and the body contact coupled with the portion of the well; and
   a resistor located in a second cavity defined in the buried oxide layer, wherein the resistor is horizontally separated from the body contact by a portion of the buried oxide layer.

2. The structure of claim 1 further comprising:
   a contact region comprised of a portion of the device layer; and
   an interconnect structure including a contact that is coupled with the contact region,
   wherein the contact region couples the body contact with the contact.

3. The structure of claim 2 wherein the contact region is comprised of single crystal semiconductor material, and the contact region, the body contact, and the well have the same conductivity type.

4. The structure of claim 2 further comprising:
   a trench isolation region in the device layer,
   wherein the body contact extends beneath the trench isolation region to be coupled with the portion of the well.

5. The structure of claim 1 further comprising:
   a contact region coupled with the body contact and comprised of a portion of the body contact; and
   an interconnect structure including a contact that is coupled with the contact region,
   wherein the contact region couples the body contact with the contact.

6. The structure of claim 5 wherein the contact region is comprised of polycrystalline semiconductor material, and the contact region, the body contact, and the well have the same conductivity type.

7. The structure of claim 5 further comprising:
a trench isolation region in the device layer,
wherein the body contact extends beneath the trench isolation region to be coupled with the portion of the well.

8. The structure of claim 1 further comprising:
a contact region coupled with the body contact; and
an interconnect structure including a first contact that is coupled with the contact region and a second contact that is coupled with the resistor.

9. The structure of claim 1 wherein the body contact and the resistor are comprised of polycrystalline semiconductor material, and the body contact is separated from the resistor by a section of the buried oxide layer.

10. The structure of claim 1 further comprising:
a handle wafer contact located in a second cavity defined in the buried oxide layer, the handle wafer contact and the second cavity extending through the buried oxide layer to a handle wafer of the silicon-on-insulator substrate or to a permanent substrate replacing the handle wafer,
wherein the handle wafer contact and the body contact are comprised of polycrystalline semiconductor material.

11. A method comprising:
forming a first opening extending through a device layer of a silicon-on-insulator substrate and partially through a buried oxide layer of the silicon-on-insulator substrate;
laterally etching the buried oxide layer at a location of the first opening to define a first cavity located entirely in the buried oxide layer and partially located beneath a section of the device layer;
filling the first cavity with a semiconductor material to form a body contact; and
forming a well in the section of the device layer,
wherein the body contact is coupled with a portion of the well.

12. The method of claim 11 further comprising:
forming a trench isolation region in the first opening and comprised of a dielectric material,
wherein the trench isolation region is vertically located above a portion of the body contact and the body contact extends beneath the trench isolation region to couple with the portion of the well.

13. The method of claim 12 further comprising:
forming a contact region comprised of a portion of the device layer; and
forming a contact in an interconnect structure that is coupled with the contact region,
wherein the trench isolation region is located horizontally between the well and the contact region, and the contact region couples the body contact with the contact.

14. The method of claim 12 further comprising:
forming a contact region comprised of a portion of the body contact; and
forming a contact in an interconnect structure that is coupled with the contact region,
wherein the trench isolation region is located horizontally between the well and the contact region, and the contact region couples the body contact with the contact.

15. The method of claim 11 further comprising:
forming a field effect transistor with a gate electrode overlying the well.

16. The method of claim 11 further comprising:
forming a second cavity in the buried oxide layer; and
filling the second cavity with the semiconductor material to form a resistor,
wherein the first cavity and the second cavity are simultaneously formed, and the first cavity and the second cavity are simultaneously filled with the semiconductor material.

17. The method of claim 11 wherein the well is formed by ion implantation, and further comprising:
implanting the body contact during the ion implantation forming the well.

18. The method of claim 11 further comprising:
forming a second cavity that extends through the buried oxide layer to a handle wafer of the silicon-on-insulator substrate or to a permanent substrate replacing the handle wafer; and
filling the second cavity with the semiconductor material to form a handle wafer contact,
wherein the first cavity and the second cavity are simultaneously formed, and the first cavity and the second cavity are simultaneously filled with the semiconductor material.

* * * * *